United States Patent [19]

Reber

[11] Patent Number: 4,604,329

[45] Date of Patent: * Aug. 5, 1986

[54] HIGH TECHNOLOGY DECORATIVE MATERIALS AND FABRICATION OF SAME

[76] Inventor: William L. Reber, 16321 Pacific Coast Hwy., #131, Pacific Palisades, Calif. 90272

[*] Notice: The portion of the term of this patent subsequent to Dec. 25, 2001 has been disclaimed.

[21] Appl. No.: 658,409

[22] Filed: Oct. 5, 1984

Related U.S. Application Data

[63] Continuation-in-part of Ser. No. 523,683, Aug. 16, 1983, Pat. No. 4,490,440.

[51] Int. Cl.⁴ .............................................. B44D 1/52
[52] U.S. Cl. .................................... 428/620; 29/160.6; 63/32; 350/162.18; 427/82; 427/89; 428/621; 428/624; 428/626
[58] Field of Search ............... 428/203, 209, 901, 620, 428/621, 624, 626; 350/162.18; 63/32; 29/160.6

[56] References Cited

U.S. PATENT DOCUMENTS 3,412,575 11/1968 Feldman et al. ......................... 63/32
3,515,459 6/1970 Wood .............................. 350/162.18
3,959,527 5/1976 Droege ................................... 63/32
4,094,575 6/1978 Kellie ............................ 350/162.18

Primary Examiner—Theodore E. Pertilla
Attorney, Agent, or Firm—Cislo, O'Reilly & Thomas

[57] ABSTRACT

A novel method is provided for producing high technology decorative materials that incorporates both computer-aided design and semiconductor processing. The high technology decorative materials thereby produced also make use of microscopic diffraction gratings for generating a dynamic spectral pattern of changing colors when exposed to ambient light such as sunlight, incandescent light, and the like. The decorative materials comprise a semiconductor substrate (10), at least one patterned coating (14) formed on one major surface (12) of the substrate and a transparent layer (28) formed thereover. The patterned coating comprises a material that is capable of being patterned to the dimensions required to diffract incident visible light and includes a series of lines (26) having an arrangement, spacing and width such that incident light will be diffracted in a pleasing pattern. A suitable jewelry mount (44) is attached to individual pieces formed from the substrate.

28 Claims, 18 Drawing Figures

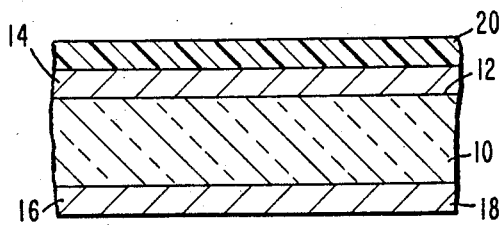
Fig. 1a.
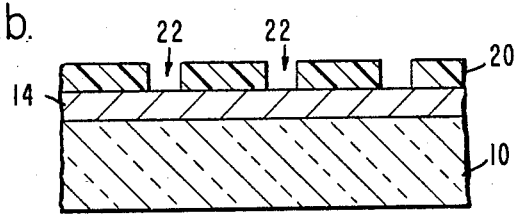
Fig. 1b.
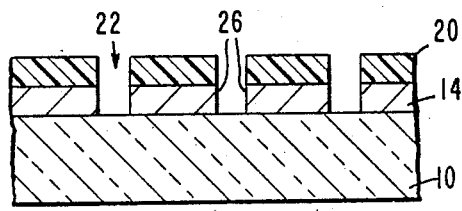
Fig. 1c.
Fig. 1d.
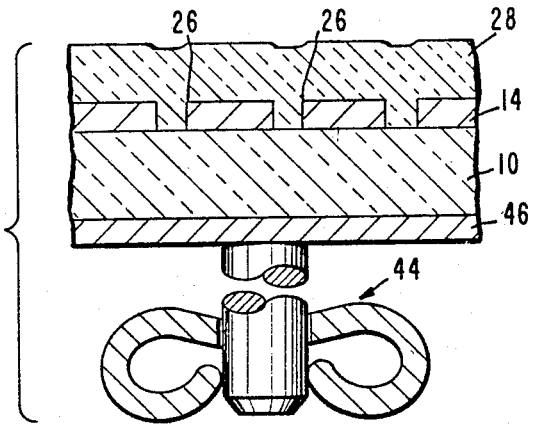

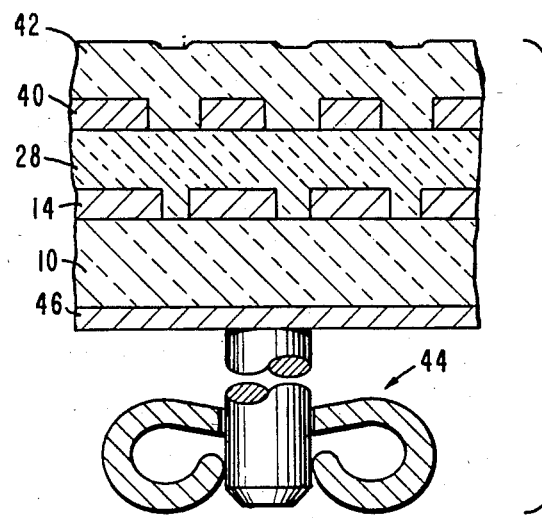
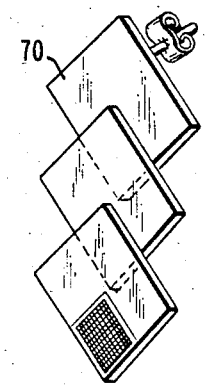
Fig. 7a.
Fig. 7b.
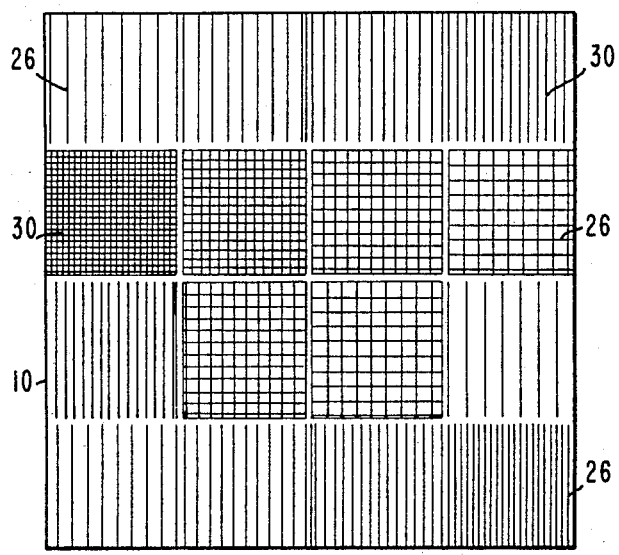
Fig. 5.
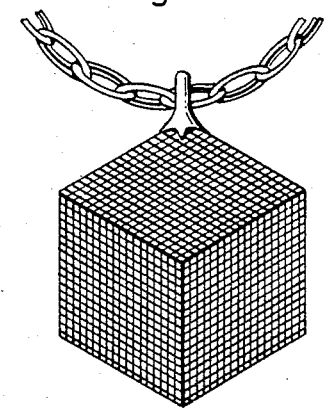

HIGH TECHNOLOGY DECORATIVE MATERIALS AND FABRICATION OF SAME

RELATIONSHIP TO OTHER APPLICATIONS

This application is a continuation-in-part application of Ser. No. 06/523,683, filed Aug. 16, 1983 now Pat. No. 4,490,440 issued 12/25/84.

BACKGROUND OF THE INVENTION

This invention pertains to high technology decorative materials, such as jewelry, that is, decorative materials designed and fabricated employing state of the art technology, including computer-aided design and semiconductor processing techniques. Particular use is made of electron beam technology for generating both micrometer and submicrometer line widths.

While decorative materials, such as jewelry, have provided adornment for men and women from time immemorial, most advances in design and fabrication have occurred only slowly. Curiously, only limited success has been made in marrying jewelry fabrication with the science and technology available at that time.

Exemplary of such recent attempts is the so-called diffraction jewelry, developed some years ago, utilizing diffraction gratings previously developed for use in scientific instruments. Such jewelry, e.g., pendants and earrings, is typically generated by mechanical ruling processes or by optical processes such as holography. The patterns that are generated by these techniques are generally regular in nature, e.g., circular or linear. Although this jewelry is capable of diffracting incident light into a myriad of rainbow colors, these replicated gratings lack the precise detail and high quality which can be achieved using state of the art technology available at the present time and described in the aforementioned patent application. In addition, the diffraction jewelry is limited in visual design by the constraints imposed by the initial process, either mechanical ruling or optical holography, that is used to generate the gratings.

SUMMARY OF THE INVENTION

In accordance with the invention, a decorative article of manufacture is provided. The decorative article, also termed herein as high technology jewelry or decorative material, comprises:

(a) a semiconductor substrate;

(b) a coating formed on at least one side of the substrate; and (c) a transparent layer formed on the surface of the coating. The substrate coating is patterned prior to forming the transparent layer thereon. The pattern comprises a series of graphic shapes such as rectangular and/or circular elements which are generated through the use of a computer-aided design system. The resulting pattern has an arrangement of areas which are either filled, e.g., lines, rectangles and the like or exist as empty spaces. The lines evidence a ratio of line width to line spacing of about 1:1 to 3:1. It is the arrangement of these areas within the designed pattern, in addition to the actual dimension of area and space, that results in the diffraction of incident light into a pleasing pattern.

The process of the invention comprises:

(a) providing a semiconductor substrate;

(b) forming a patterned coating on at least one surface of the substrate, the pattern capable of diffracting incident light; and (c) providing a protective transparent layer on the patterned coating. The patterned coating is formed by a process, known as computer-aided design (CAD), which includes generating geometric data in a computer data base. The geometric data represents line spacing, line width and line arrangement relating to the pattern.

The aesthetically pleasing pattern is formed in the substrate coating using electron beam techniques. Electron beam lithography can be used to generate high resolution geometries having micrometer or submicrometer dimensions. Alternatively, reticles and masks may be replaced by employing electron beam technology for directly writing patterned information onto the semiconductor substrate or coating.

The transparent layer serves to protect the underlying patterned coating. The finished product is durable, resistant to scratches and abrasion and evidences a high spectral diffraction efficiency. Further, the high technology jewelry of the invention evidences a precise detail, provided by the use of computer-aided design equipment, and a high quality, provided by the use of state of the art semiconductor processing.

Other advantages of the invention will become apparent from a study of the following portion of the specification, the claims and the attached drawings, in which like numbers represent like elements.

BRIEF DESCRIPTION OF THE DRAWING

FIGS. 1a–d depict, in cross-section, portions of the process employed in fabricating the high technology jewelry of the invention;

FIG. 5 depicts, in greatly enlarged plan view, an example of a pattern capable of producing an aesthetically pleasing output of diffracted light;

FIG. 6 depicts, in cross-section, a second embodiment of the invention; and

FIGS. 7a–b depict examples of alternate mountings.

DETAILED DESCRIPTION OF THE INVENTION

Figure 2A:
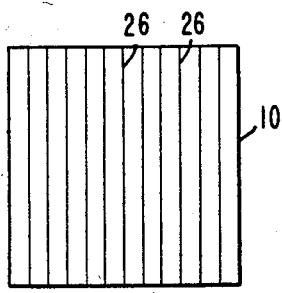
FIGS. 2a–f depict, in plan view, various examples of rectilinear cells.

In fabricating the high technology decorative materials of the invention, a semiconductor substrate is provided. The substrate preferably comprises silicon, but may also comprise other suitable semiconductor materials, such as germanium or gallium arsenide. The properties of the substrate itself are not important, other than it be of a thickness and durability to withstand the rigors of processing and subsequent handling by the wearer or user. Indeed, the usual concern in semiconductor fabrication as to purity, dopant species, dopant concentration, conductivity type and the like are inconsequential; reject quality material may suitably be employed. Nor is cleaning required to the same extent as in conventional semiconductor processing. The surface of the substrate need only be cleaned sufficiently to accept a coating, such as described below. Exemplary of such cleaning procedures is a dip in trichloroethylene.

As depicted in FIG. 1a, a semiconductor substrate 10, here silicon, is shown, having formed on one major surface 12 (the front surface) thereof a coating 14. A coating 16 may optionally be provided on the back major surface 18 for aesthetic purposes.

Wafers are appropriately employed as substrates. In the conventional fabrication of silicon-based devices, wafers about 3 to 4 inches in diameter are generally used at the present time, and such wafers, which are typically about 20 mils thick, are suitably used herein. However, other diameters and thicknesses may be employed as the state of the art advances.

The coating 14 (and 16) comprises any material that is capable of being patterned to micrometer and submicrometer dimensions so as to diffract incident light. Exemplary of such materials are metals, such as gold, aluminum, silver, titanium, nickel, tantalum and the like, and dielectrics such as oxides, particularly inorganic oxides such as silicon dioxide, and photoresists. The material may be reflective, such as a metal as described above so as to provide an additional decorative effect arising from the presence of the metal itself, or the material may be transparent, so long as it may be suitably patterned as described above.

The thickness of the coating 14 advantageously ranges from about 0.5 to 1 micrometer. Although the thickness is not particularly critical, it is desirably uniform. For thicknesses considerably less than about 0.5 micrometer, pinholes may develop during deposition, leading to a decrease in reflectivity. On the other hand, for thicknesses considerably greater than about 1 micrometer, undesirably long processing times are encountered, with unnecessary waste of material.

The coating 14 is suitably formed on the surface of the substrate 10 by deposition processes conventional in the art of semiconductor fabrication, such as vacuum deposition, sputtering, etc.

Next, the coating is patterned, employing conventional lithographic techniques. While many such techniques are available, electron beam lithography is preferred because it is capable of generating the requisite pattern dimensions. Electron beam technology permits the pattern generation of a mask, using an e-beam resist. The mask is then employed in conjunction with a conventional photoresist layer on the substrate coating to be patterned, with exposure of the masked photoresist, for example, to optical radiation incrementally stepped across the resist-coated wafer. Alternatively, e-beam technology permits the use of direct-writing the desired pattern in the substrate coating. The process for preparing the pattern is described next, followed by a description of its use in the patterning process.

The desired pattern is first created, using well-known computer-aided design (CAD) techniques, to generate a computer data base. CAD permits greater freedom in the initial design phase and is not limited by the constraints of optical or mechanical consideratons associated with the conventional fabrication of diffraction jewelry/materials by interference techniques or mechanical ruling. Indeed, CAD is limited only by the imagination of the user. Many pleasing patterns, including polygons, irregular shapes, curvilinear designs, graphics symbols, alpha-numeric characters and imagery, such as pictures and digitized lines, not otherwise achievable with prior art optical or mechanical approaches, are easily within the domain of CAD.

In using CAD, geometric information is represented in the data base relating to line spacing, line width and line length, as well as to the arrangement of a series of lines, such that the completed pattern in coating 14 will itself be geometrically pleasing, and will produce an aesthetically pleasing diffraction pattern when exposed to light in the visible region (e.g., sunlight, incandescent light, moonlight). Once the desired pattern is generated, then a pattern generation (PG) tape is prepared, based on the layout of the geometric pattern. Designs having very dense patterns and dimensions less than about 3 micrometers can be produced using e-beam pattern generators for mask making, as is known in this art.

In this process, data from the pattern generation tape is inputted to the e-beam pattern generator. A scanning beam of electrons is directed upon a mask substrate (e.g., chrome on glass—not shown), which can be coated with a positive e-beam resist such as PBS (polybutylene sulfone). Those areas exposed to the e-beam are then removed during subsequent chemical processing. The chrome layer can then be etched to produce the desired pattern in the mask. Masks (or reticles) can be easily produced having critical dimensions in both the micrometer and submicrometer range. The mask or reticle is then directly stepped on the wafer, rather than employing contact copying. In this process, the pattern in the reticle is incrementally stepped and focused on the wafer for maintaining registration and image quality.

Alternatively, employing the direct-writing-on-wafer approach, the pattern generated above may be used to steer the e-beam over the surface of the coated wafer to form the desired patterns in the coating, without the need for masks. This process is also known in the art.

Continuing in the description of the process of fabricating the decorative article of manufacture of the invention employing the mask approach, a photoresist layer 20 is deposited on the coating 14, as shown in FIG. 1a. A positive photoresist, such as Shipley AZ 1350, may be employed, since in such materials, regions exposed to actinic radiation to form the pattern are cross-linked (polymerized) relative to unexposed regions. However, negative resists may also be suitably employed in the practice of the invention. A reticle (not shown) containing the desired pattern is used in the direct step on wafer process to provide regions in the photoresist layer 20 which replicate regions in the reticle. Following exposure to actinic radiation, exposed regions are then removed, such as by a wet process (chemical etching) or a dry process (plasma etching). The removed regions thereby expose underlying portions of the coating 14 through openings 22, shown in FIG. 1b. The exposed portions of the coating 14 are then etched, either chemically, such as with an appropriate acid (metal coating) or solvent (photoresist coating), or with plasma, to generate a relief pattern. The etching advantageously removes material all the way to the surface 12 of the substrate 10, further extending the openings 22, as shown in FIG. 1c. Alternatively, the etching may remove only a portion of the exposed regions, so long as the openings are of sufficient depth such that, in conjunction with the width of the lines 26 thus produced, the relief is of sufficient dimension so as to provide diffraction of incident light. The remaining photoresist layer employed in the lithographic process is removed with a suitable solvent, leaving a patterned series of lines 26 in the coating 14, as seen in cross-section in FIG. 1d and in plan view in FIG. 2.

Alternatively, the photoresist layer 20 may be deposited directly on the substrate 10 and patterned as above to form openings 22. The coating 14 may then be deposited over the entire photoresist layer, including the openings 22. Then, employing well-known "lift-off" techniques, the photoresist may be removed, taking with it the coating filling the openings, thereby providing the patterned coating on the substrate.

The process steps of the invention may be set forth as follows:

Masked beam

1. CAD-design work
   a. Layout/artwork
   b. Generate PG tape
   c. Convert to e-beam format (mask)
2. E-beam pattern generator
3. E-beam mask
   a. Direct step on wafer
   b. Contact copying
4. Process wafer Direct write 1. CAD-design work
   a. Layout/artwork
   b. Generate PG tape
   c. Convert to e-beam format (direct write)
2. E-beam direct write on wafer
3. Process wafer The width and spacing of the lines 26 are judiciously selected so as to be consistent with the particular processing technology employed and to provide variability in the visual effect of the overall design. Further, the ratio of line width to line spacing should range from about 1:1 to 3:1 to maximize the diffraction effect. By incorporating patterns having variable dimension, the light diffraction resulting from the design can be altered in new and pleasing spectral patterns of colors. In addition, the colors of the diffracted light are made to change in a dynamic manner if either the light source incident upon the design or the individual viewing the diffracted light moves. Examples of suitable line widths and spacings range from about 3 to 0.5 micrometers, employing variable line spacing and variable dimensions (width and length), within the ratio of line width to line spacing constraints above.

It is the combination of micrometer and submicrometer dimensions and the variability of different size and width patterns and different line densities, all a direct result of using computer-aided design techniques, that provides the high quality dynamic spectral behavior of the designed high technology decorative material. This capability simply does not exist in the domains of diffraction gratings generated by either mechanical processes or optical interference processes such as holography.

A transparent layer 28 is then deposited over at least the patterned coating 14 on the substrate 10, as shown in FIG. 1d, to form the finished product. Such a layer must be durable in order to protect the underlying coating 14 against scratches, abrasion, etc., and may comprise a transparent oxide, such as silicon dioxide or silica-based glass, or a transparent plastic, such as a polyurethane or a polyimide. The deposition of such materials is well-known.

The layer 28 is deposited to a thickness of about 1 to 3 micrometers. At thicknesses substantially less than about 1 micrometer, the layer will not adequately protect the underlying coating, while at thicknesses substantially greater than about 3 micrometers, the layer would craze, which would tend to destroy the aesthetic effect of the final product. The layer 28 is substantially transparent, in order to permit the maximum diffraction effect to be perceived.

Figure 2B:
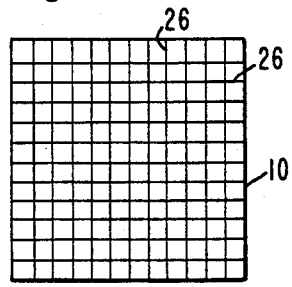
Figure 2C:
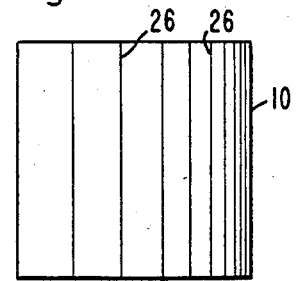
Figure 2D:
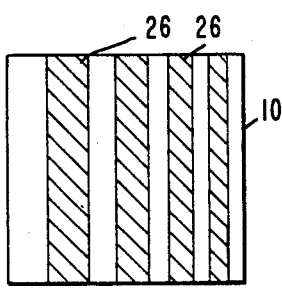
Figure 2E:
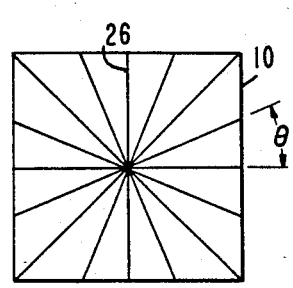
Figure 2F:
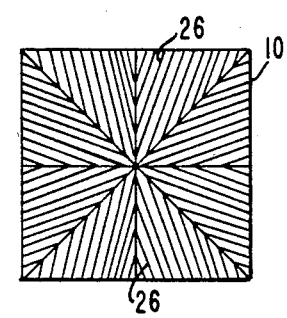

Examples of various patterns achievable by the teachings of the invention are shown in FIGS. 2a-f, 3a-c and 4. FIG. 2a depicts lines 26 of constant width, constant spacing and consequent constant ratio of line width to line spacing, with a single orientation. FIG. 2b depicts lines 26 of constant width, constant spacing and consequent line width to line spacing, with multiple orientations (shown here as 90 degrees, although other orientations are also possible). FIG. 2c depicts lines 26 of constant width, variable line spacing and consequent variable ratio of line width to line spacing, with a single orientation. FIG. 2d depicts lines 26 of variable width, variable spacing and consequent variable ratio of line width to line spacing, with a single orientation. FIG. 2e depicts radial lines 26 of constant width, separated by a fixed angle theta. FIG. 2f depicts triangular areas 50 having variously oriented lines 26.

Figure 3A:
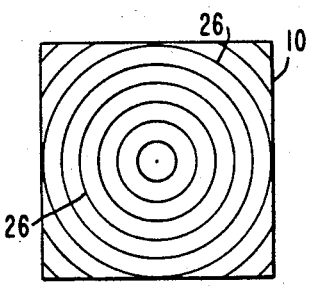
FIGS. 3a–c depict, in plan view, various examples of arcuate cells.
Figure 3B:
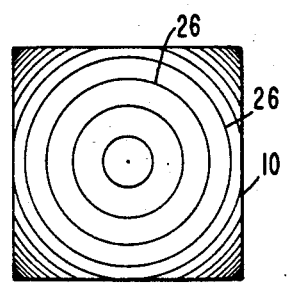
Figure 3C:
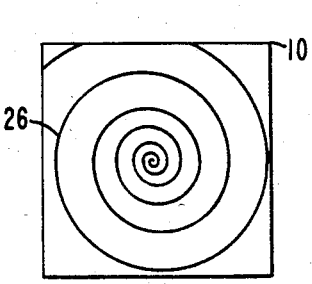

FIG. 3a depicts lines 26 equally spaced in concentric circles, with a fixed frequency. FIG. 3b depicts lines 26 having a spacing that varies inversely with increasing radius (similar to the pattern of a Fresnel zone plate). FIG. 3c depicts a spiral comprising a single line 26.

Figure 4:
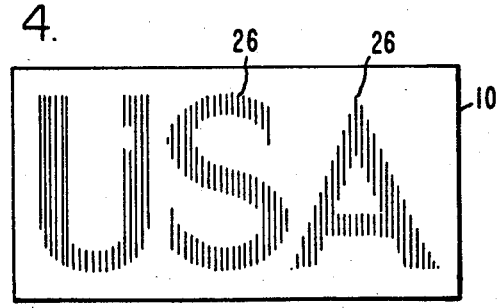
FIG. 4 depicts, in plan view, a graphic example.

FIG. 4 depicts an example of a graphics design, using lines 26 of, e.g., fixed width and spacing to form the design.

There are many considerations in selecting patterns that will diffract incident light in a pleasing manner. One such pattern is depicted in FIG. 5. There, a series of cells 30 are arranged in a geometric pattern to form the novel jewelry piece of the invention. Cells comprising a series of lines 26 are considered to be "live" cells; that is, these are cells which will diffract incident light. Other regions (not shown) may be formed by the absence of lines, comprising instead relatively flat areas and may encompass an area of size up to approximately that of the live cells. Such regions are considered to be "dead" regions, since they do not diffract incident light. Thus, patterns may be created out of combinations of live cells and dead cells, as well as out of combinations of lines, shapes, symbols, etc. of various spacings.

In general, a unit cell may comprise a particular orientation of parallel lines 26. Rows may comprise unit cells having the same or alternating or other orientations. The unit cell may be rotated 90 degrees to achieve another unit cell having an orthogonal orientation. Other orientations and composite designs, in addition to various orientations of parallel lines, such as rectilinear, polygonal and arcuate shapes, as well as graphics symbols, alpha-numeric characters and imagery, are also possible, as described above. Indeed, with regard to the foregoing description and examples depicted in the Figures, it is clear that the designer of the high technology decorative materials described and claimed herein is limited only by imagination in constructing pleasing patterns. Thus, the composite cell comprises a pattern of unit cells providing regions of diffraction gratings having different orientations of their lines, thereby giving rise to interesting optical reflections from the decorative materials when illuminated by ambient light.

Additional pleasing patterns may be achieved by depositing a second coating 40 over the first coating 14, optionally spaced apart by oxide 28, as shown in FIG. 6. Other suitable materials, such as polyimides, which provide a smooth surface, may preferably be employed. The second coating is patterned by employing the same process as that used for the first coating, and a protective layer 42 is formed over the entire composite, employing the same process as that used for layer 28. The second coating may, if desired, comprise a flash coating of a more expensive metal over an inexpensive patterned metal coating.

The second coating may comprise the same material as that of the first coating or may comprise dissimilar materials (e.g., gold over aluminum) to obtain a pleasing or 3-D effect. The use of two coatings also permits the formation of Moire patterns, which, if suitably chosen, provide an aesthetically pleasing compliment to the diffraction patterns generated by each coating. The second level of coating may be in an orientation parallel to the first coating, as depicted in FIG. 6, or orthogonal thereto or at some intermediate angle thereto.

In fabricating the high technology decorative materials of the invention, a plurality of pieces are simultaneously formed on a single wafer. The wafer is then diced and sliced, using well-known techniques, to provide the individual decorative pieces. Alternatively, irregular shapes and/or holes in the individual pieces may be obtained by isotropic etching of the semiconductor substrate; such isotropic etchants are well-known in the art and form no part of this invention.

Jewelry pieces may then be individually provided with a jewelry finding 44 (shown in FIGS. 1d and 6), which enables the coated substrate to be worn as an earring (as depicted here), a pendant, bracelet, ring, brooch, necklace, tie tack, tie bar, cuff links, or other decorative object. The jewelry finding is attached to the substrate 10 by conventional means, such as with a suitable epoxy. Preferably, the jewelry finding may include a pedestal mount 46, such as metal or plastic, which is attached to the substrate to provide additional support. Other arrangements are also possible, such as attachment of one or more jewelry pieces 30 onto a suitable substrate, for example, a decorative metal or plastic substrate 70, for fabricating earrings, necklaces, pins and the like, as shown in FIG. 7a. Or, the jewelry piece may be assembled with other pieces to form various 2- and 3-D designs, such as a cube 72 comprising a plurality of cells 30 cemented together, as shown in FIG. 7b. Jewelry findings may be attached to these other arrangements, all of which are considered herein to be jewelry mounts.

EXAMPLES

Example 1

A pair of earrings was fabricated, having a repetitive pattern similar to that depicted in FIG. 2. A silicon wafer, 4 inches in diameter and 20 mils thick, was processed to provide a plurality of jewelry pieces, each measuring about 1×1 centimeter. A coating of silicon dioxide, 1 micrometer thick, was formed on the surface of the silicon wafer by vacuum deposition. The jewelry pieces were patterned with live cells approximately 2.5 millimeters square, having line spacings ranging from 3 micrometers to 0.75 micrometers, with a ratio of line width to line spacing of 1:1.

The design was produced using computer-aided design techniques as follows. A representation of the artwork was generated and stored in a computer data base. The artwork in the computer data base was then converted to a pattern generation (PG) tape. An electron beam mask was then produced on an e-beam pattern generation system from the PG tape.

The resulting pattern on the e-beam reticle was then used in an optical process to directly step the pattern across the wafer. In this way, a photosensitive (positive) resist was exposed to radiant energy, thereby opening appropriate areas in the resist to provide subsequent etching of the underlying silicon dioxide coating.

After the underlying coating had been etched, the remaining resist was removed and a low temperature silicon dioxide coating of approximately 3 micrometers was deposited on the entire wafer. The wafer was then scribed along the outlines of the 1 cm × 1 cm parts. The parts were then obtained by cleaving separate pieces from the wafer. These parts were then attached to appropriate jewelry findings to produce the desired product.

Example 2

The process described in Example 1 was repeated, except that the silicon wafer was coated with a coating of aluminum 1 micrometer thick in place of the 1 micrometer coating of silicon dioxide.

Example 3

The process described in Example 1 is repeated, except that the silicon wafer is coated with a coating of gold 1 micrometer thick. A thin layer of silicon oxide is first deposited on the silicon wafer, prior to the deposition of the gold layer, to improve adhesion of the gold layer to the substrate.

The invention has been described in its presently contemplated best mode and it is clear that it is susceptible to numerous modifications, modes and embodiments within the inventive faculty. Therefore, the scope of this invention is defined by the scope of the following claims.

What is claimed is:

1. A decorative article of manufacture, comprising:
   (a) at least one semiconductor substrate;
   (b) a patterned coating formed on a major surface of said substrate, said patterned coating having formed therein a series of lines arranged in a variety of patterns such that incident light will be diffracted in a pleasing pattern, said lines evidencing a ratio of line width to line spacing of about 1:1 to 3:1; and
   (c) a transparent layer formed over said at least one patterned coating.

2. The article of claim 1 in which said semiconductor substrate consists essentially of silicon.

3. The article of claim 1 in which said patterned coating ranges from about 0.5 to 1 micrometer in thickness.

4. The article of claim 1 in which said patterned coating consists essentially of a metal selected from the group consisting of gold, aluminum, silver, titanium, nickel and tantalum.

5. The article of claim 4 in which said patterned coating is selected from the group consisting of gold, aluminum and silver.

6. The article of claim 1 in which said patterned coating consists essentially of a transparent dielectric material.

7. The article of claim 6 in which said patterned coating consists essentially of a material selected from the group consisting of inorganic oxides and photoresists.

8. The article of claim 1 in which said lines evidence line widths and line spacings of less than about 3 micrometers.

9. The article of claim 1 in which said transparent layer consists essentially of a material selected from the group consisting of transparent oxides and transparent plastics.

10. The article of claim 9 in which said transparent layer consists essentially of a material selected from the group consisting of silica-based materials, polyurethanes and polyimides.

11. The article of claim 9 in which said transparent layer ranges from about 1 to 3 micrometers in thickness.

12. The article of claim 1 further including a jewelry mount attached to said semiconductor substrate.

13. The article of claim 12 in which a decorative substrate is interposed between said jewelry mount and said semiconductor substrate.

14. A process for fabricating a decorative article of manufacture comprising:
  (a) providing at least one semiconductor substrate;
  (b) forming a patterned coating on a major surface of said semiconductor substrate, said patterned coating formed by a process which includes generating geometric data in a computer data base, said geometric data representing line spacing, line width and line arrangement relating to said pattern, the pattern capable of diffracting light in a pleasing pattern and having a series of lines arranged in a variety of patterns, said lines having a ratio of line width to line spacing of about 1:1 to 3:1; and
  (c) forming a protective transparent layer on said patterned coating.

15. The process of claim 14 in which said semiconductor substrate consists essentially of silicon.

16. The process of claim 14 in which said coating is formed to a thickness ranging from about 0.5 to 1 micrometer.

17. The process of claim 14 in which said coating consists essentially of a transparent dielectric material.

18. The process of claim 17 in which said coating consists essentially of a material selected from the group consisting of inorganic oxides and photoresists.

19. The process of claim 14 in which said coating consists essentially of a metal selected from the group consisting of gold, aluminum, silver, titanium, nickel and tantalum.

20. The process of claim 14 in which said lines evidence line widths and line spacings less than about 3 micrometers.

21. The process of claim 14 in which said transparent layer consists essentially of a material selected from the group consisting of transparent oxides and transparent plastics.

22. The process of claim 21 in which said transparent layer consists essentially of a material selected from the group consisting of silica-based materials, polyurethanes and polyimides.

23. The process of claim 14 in which said transparent layer is formed to a thickness ranging from about 1 to 3 micrometers.

24. The process of claim 14 further comprising forming individual pieces from said semiconductor substrate.

25. The process of claim 24 further comprising attaching a jewelry mount to an individual piece.

26. The process of claim 25 in which a decorative substrate is interposed between said jewelry mount and said individual piece.

27. The process of claim 14 in which said computer data base is used to prepare a lithographic mask, which is then employed in conjunction with a suitable resist to generate said pattern in said coating by means of an electron beam.

28. The process of claim 14 in which said computer data base is used to steer an electron beam over the surface of said coated substrate covered with a layer of an appropriate resist.

* * * * *